United States Patent
Mito et al.

(10) Patent No.: US 9,105,795 B2
(45) Date of Patent: Aug. 11, 2015

(54) COMPOSITE SUPERCONDUCTOR

(75) Inventors: Toshiyuki Mito, Toki (JP); Kazuya Takahata, Toki (JP); Toshiya Okada, Tokyo (JP); Toshio Ushiyama, Tokyo (JP); Masahiro Sugimoto, Tokyo (JP); Hirokazu Tsubouchi, Tokyo (JP)

(73) Assignees: INTER-UNIVERSITY RESEARCH INSTITUTE CORPORATION NATIONAL INSTITUTES OF NATURAL SCIENCES, Tokyo (JP); FURUKAWA-SKY ALUMINUM CORPORATION, Tokyo (JP); THE FURUKAWA ELECTRIC CO., LTD., Tokyo (JP)

( * ) Notice: Subject to any disclaimer, the term of this patent is extended or adjusted under 35 U.S.C. 154(b) by 1035 days.

(21) Appl. No.: 12/160,964

(22) Filed: Jul. 15, 2008

(65) Prior Publication Data
US 2010/0222222 A1 Sep. 2, 2010

Related U.S. Application Data

(63) Continuation of application No. PCT/JP2007/050419, filed on Jan. 15, 2007.

(30) Foreign Application Priority Data

Jan. 16, 2006 (JP) .................. 2006-007993

(51) Int. Cl.
*H01F 6/00* (2006.01)
*H01L 39/00* (2006.01)
*H01L 39/14* (2006.01)
(Continued)

(52) U.S. Cl.
CPC . *H01L 39/14* (2013.01); *H01F 6/06* (2013.01); *H01L 39/2409* (2013.01); *Y10T 428/31678* (2015.04)

(58) Field of Classification Search
USPC .................. 505/220, 230, 231, 431, 706, 433; 428/373, 930, 457; 174/125.1, 15.4, 174/15.5; 29/599
See application file for complete search history.

(56) References Cited

U.S. PATENT DOCUMENTS 4,079,187 A * 3/1978 Fillunger et al. ............. 174/15.5
4,554,407 A * 11/1985 Ceresara et al. ........... 174/125.1
5,718,034 A * 2/1998 Huang et al. .................... 29/599
(Continued)

FOREIGN PATENT DOCUMENTS

GB 1 199 549 A 7/1970
GB 1199549 * 7/1970 ............. H01V 11/00
(Continued)

OTHER PUBLICATIONS

Toshinari Ando, Nb3Sn Conductor Development for Fusion Power Applications, Cryogenic Engineering 39 vol. 9, Sep. 2004, pp. 383-390, Japan.
(Continued)

*Primary Examiner* — Colleen Dunn
(74) *Attorney, Agent, or Firm* — Yoshida & Associates, LLC

(57) ABSTRACT

Disclosed is a composite superconductor comprising a superconductor and a metal member. The metal member is composed of one or more members to be joined together in such manner that the one or more members cover the superconductor, and at least one member is made of aluminum or an aluminum alloy.

12 Claims, 2 Drawing Sheets

(51) Int. Cl.
*H01F 6/06* (2006.01)
*H01L 39/24* (2006.01)

(56) References Cited

U.S. PATENT DOCUMENTS

| | | | | |
|---|---|---|---|---|
| 6,470,564 | B1* | 10/2002 | Wada | 29/599 |
| 6,926,970 | B2* | 8/2005 | James et al. | 428/615 |
| 2002/0198111 | A1* | 12/2002 | Tomsic | 505/230 |

FOREIGN PATENT DOCUMENTS

| JP | 9-69318 | A | | 3/1997 | | |
|---|---|---|---|---|---|---|
| JP | 9-73821 | A | | 3/1997 | | |
| JP | 9-73824 | A | | 3/1997 | | |
| JP | 10-321060 | A | | 12/1998 | | |
| JP | 11-086648 | A | | 3/1999 | | |
| JP | 2000-164053 | A | | 6/2000 | | |
| JP | 2000-294053 | A | | 10/2000 | | |
| JP | 2001-267120 | | * | 9/2001 | | H01F 6/06 |
| JP | 2001-283653 | | * | 10/2001 | | H01B 12/10 |
| JP | 2001-283653 | A | | 10/2001 | | |

OTHER PUBLICATIONS

Norikiyo Koizumi et al., Development of a Nb3Al Conductor to be Applied to a Fusion Reactor and Its Application to a Large Superconducting Coil, Cryogenic Engineering 38 vol. 8, 2003, pp. 391-398, Japan.

Extended European Search Report dated Jun. 28, 2012 for corresponding EP Application No. 07706753.6.

English Translation of Japanese Office Action dated Dec. 2, 2011 for Japanese Application No. 2007-005317, which claims priority to JP 2006-007993, corresponding to the present application.

* cited by examiner

COMPOSITE SUPERCONDUCTOR

RELATED APPLICATION DATA

This application is a 35 U.S.C. §371 continuation application of international application No PCT/JP2007/050419, filed on Jan. 15, 2007 the entire content of which is hereby incorporated by reference.

TECHNICAL FIELD

The present invention relates to a composite superconductor comprising a superconductor and metal material such as aluminum, applicable to not only the conventional alloy superconductor (for example, NbTi or the like) but also compound superconductor which is vulnerable to the mechanical distortion (for example, $Nb_3Sn$, $Nb_3Al$, Bi-system superconductor, Y-system superconductor, $MgB_2$ superconductor or the like). Hereinafter the aluminum means pure aluminum or pure aluminum alloy defined in the standard.

BACKGROUND ART

In general, the superconductor is cooled to maintain the superconductor properties by means of such forced-flow cooling method or indirect cooling method as being immersed into the cooling medium such as liquid helium, or incorporating a refrigerating system. More specifically, a composite superconductor comprising a superconductor of alloy superconductor material such as NbTi or the like with aluminum is realized, using such properties of the aluminum as high specific heat, high heat transfer, adjustable electrical conductivity, small specific gravity, low radioactivity or the like (refer to the patent document 1 listed hereinafter).

However, in order to obtain highly efficient superconductor, it comes to be understood that the composite superconductor is effective, which comprises aluminum and a superconductor of compound superconductor material excellent in such superconductor properties as critical current density, critical magnetic field, and critical temperature, where thermal, mechanical, and electrical contact condition of the superconductor and the aluminum is controlled.

However, the compound superconductor material is worked to a predetermined size following drawing and rolling of the raw material including intermediate heat treatments, and then heat-treated to produce a compound superconductor functioning as superconductor. Thus produced compound superconductor is brittle to the mechanical distortion. Accordingly, the plastic working thereafter is subjected to a large constrains so as not to deteriorate the superconductor properties. More specifically, when such fabricating method as the extrusion-coating or the wire drawing is applied to the composite superconductor comprising the heat-treated compound superconductor and the metal member, in the same manner to the conventional alloy superconductor, the plastic working is applied thereto such that the critical current property is partially deteriorated, thus the above-described type of the composite superconductor is not realized yet.

Furthermore, other than the extrusion-coating method and the composite drawing method of the composite superconductor, there is known a method in which a hollow portion is formed by combining two copper members, then the compound superconductor consisting of $Nb_3Sn$ is placed in the hollow portion and then the joint portion of the copper members is soldered (refer to the non-patent document 1 listed hereinafter). Since aluminum has high heat transfer and high specific heat, it is necessary to rapidly provide large amount of heat. In addition, aluminum is promptly oxidized so that oxide layer has to be removed before soldering or brazing.

Accordingly, it is not practical to substitute the above-described copper member by the aluminum member, and then the aluminum members are jointed by soldering or brazing. On the other hand, it is also not practical to carry out the arc welding, since the arc welding (for example, TIG (tungsten inert gas) welding, or MIG (metallic inert gas) welding) has difficulty in adjustment of the heat amount imparted to the metal member during the welding so that the accuracy of the size in the joint portion is deteriorated, or the superconductor is deformed by thermal strain during the arc welding so that the critical current property is partially deteriorated.

There is known a composite superconductor comprising a compound superconductor of $Nb_3Al$ and a metal member of a tubular stainless alloy (refer to the non-patent document 2 listed hereinafter). According to the above composite superconductor, the supercritical helium is flown through the gap in the metal member so as to coercively cool the superconductor. Thus it is not possible to attain the object of the present invention in which the contact condition between the superconductor and the metal member of aluminum is to be controlled.

Patent document 1: Japanese Patent Application Publication 2000-164053;

Non-patent document 1: Cryogenic engineering 39 vol. 9, 2004, pages 383 to 390, Ando;

Non-patent document 2: Cryogenic engineering 38 vol. 8, 2003, pages 391 to 398, Koizumi

DISCLOSURE OF INVENTION

Problems to be Solved by the Invention

Object of the present invention is to provide a composite superconductor in which a superconductor such as not only the conventional alloy superconductor (for example, NbTi or the like) but also compound superconductor which is vulnerable to the mechanical distortion (for example, $Nb_3Sn$, $Nb_3Al$, Bi-system superconductor, Y-system superconductor, $MgB_2$ superconductor or the like) is covered by the metal member such as aluminum or the like.

Means for Solving the Problem

A first aspect of the composite superconductor of the invention is a composite superconductor comprising:

superconductor; and a member joined to said superconductor in such manner that said member covers said superconductor, said member comprising metal member at least one of which is aluminum or aluminum alloy.

In a second aspect of the composite superconductor of the invention, said member comprises a first member having a groove and a second member fitted to an upper portion of said groove, and said superconductor is placed in a hollow portion formed by combining said first member and said second member.

In a third aspect of the composite superconductor of the invention, said superconductor is placed itself in said hollow portion, or together with a heat transfer member to transfer heat between said superconductor and said heat transfer member, and a ratio of a total cross sectional area of the superconductor and the heat transfer member along a vertical cross section to the cross sectional area of said hollow portion is at least 70%.

With the filling rate being below 70%, it becomes remarkably difficult to control the respective heat, mechanical, and electrical contact conditions between the superconductor and the metal member, thus not preferable. Incidentally, the filling rate can be appropriately selected according to a pressure applied to the superconductor.

In a fourth aspect of the composite superconductor of the invention, the cross section of said metal member is substantially circular.

In a fifth aspect of the composite superconductor of the invention, said superconductor comprising a compound superconductor.

As examples of the compound superconductor, there are intermetallic compound superconductor such as $Nb_3Sn$, $Nb_3Al$, $MgB_2$ or the like, and oxide superconductor such as Bi-system superconductor, Y-system superconductor or the like.

In a sixth aspect of the composite superconductor of the invention, the first member and the second member is joined by a friction stir welding (FSW).

In a seventh aspect of the composite superconductor of the invention, the friction stir welding (FSW) is carried out while a pressure is applied to said superconductor.

In an eighth aspect of the composite superconductor of the invention, the first member and the second member is joined by a laser beam welding.

Effects of the Invention

According to present invention, it is possible to find the structure of the composite superconductor which enables to control respective heat, mechanical, electrical contact conditions between the superconductor and the metal member such as aluminum or the like, thus enabling to obtain a composite superconductor having properties corresponding to the intended usage. In particular, since the mechanical distortion applied to the superconductor can be controlled, the superconductor properties including critical current or the like of the compound superconductor can be prevented from being deteriorated. In addition, when the composite superconductor is formed with the compound superconductor which can increase the critical current by applying mechanical distortion to certain degree, the superconductor properties can be improved.

BRIEF DESCRIPTION OF DRAWINGS

FIG. 1 (c) illustrates a composite superconductor having a circular cross section with a flat portion and one welded portion in which one joint portion is welded by FSW.

FIG. 2 is a view illustrating embodiments of the superconductor of the invention.

FIG. 3 illustrates embodiments of a long superconductor of the invention.

BRIEF DESCRIPTION OF REFERENCES

Figure 1A:
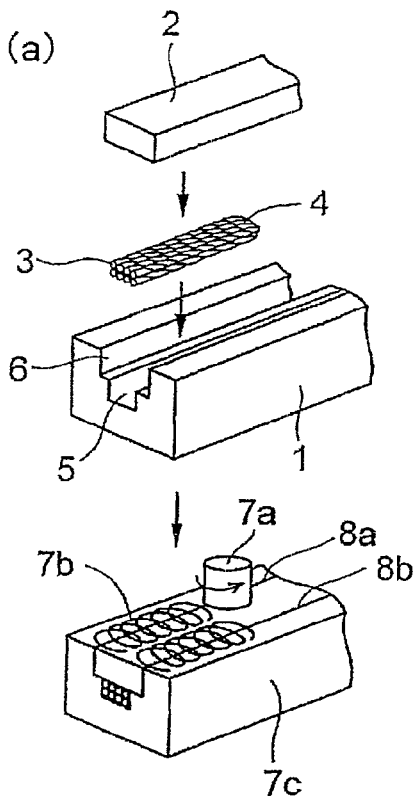
FIG. 1(a) illustrates a composite superconductor having a rectangular cross section and two welded portions in which two joint portions are respectively welded by FSW.

1 . . . groove-type aluminum member having a rectangular cross section (first member)
2 . . . fitting member (second member) bent fitting member
3 . . . superconductor wire
4 . . . formed superconductor twisted wires (t=thickness)
4' . . . bent-formed superconductor twisted wires
5 . . . lower narrow width groove portion (d=depth)
6 . . . upper wide width groove portion
7a . . . rotating tool of FSW
7b . . . welded portion by FSW
7c . . . welded portion by FSW
7d . . . welded portion by FSW
8a . . . joint portion
8b . . . joint portion
9 . . . groove-type aluminum member having a circular cross section with a flat portion
9' . . . bent groove-type aluminum member having a circular cross section with a flat portion
10 . . . groove
10' . . . bent groove
11 . . . groove-type aluminum member having a circular cross section with a flat portion and opening portion
12 . . . layered superconductors
13 . . . groove portion below the opening portion
14 . . . joint portion
15a . . . divided groove-type aluminum member
15b . . . divided groove-type aluminum member
16a . . . divided groove portion
16b . . . divided groove portion
17a . . . joint portion
17b . . . joint portion
18 . . . superconductor twisted round wires
19a . . . aluminum plate
19b . . . aluminum plate
20 . . . formed composite superconductor twisted wires
21 . . . tape-shaped superconductor
22 . . . layered superconductor 23 . . . layered superconductor.
24 . . . solder
25 . . . tape
26 . . . joint portion (in the peripheral direction)

BEST MODES FOR CARRYING OUT THE
INVENTION

With reference to FIGS. 1 to 3, embodiments of the superconductor of the present invention will now be described below.

FIG. 1(a) is a view illustrating a composite superconductor having a rectangular cross section. A groove-type aluminum member (a first member) with the rectangular cross section has a groove of two stage portions integrally formed in the aluminum member, which consist of a wide width groove portion 6 and a lower narrow width groove portion 5 narrower than the wide width groove portion 6. A formed superconductor twisted wires 4 is placed in the lower narrow width groove portion 5, an aluminum fitting member (a second member) 2 is fitted into the upper wide width groove portion 6, and then, two joint portions 8a, 8b on the upper face thereof are welded by friction stir welding (hereinafter referred to FSW).

Upon welding by FSW, it is preferable that the joint portion is pressed by a rotating tool 7a from the upper side in the drawing, because a pressure is applied in the vertical direction to the wide face of the superconductor (i.e., the formed superconductor twisted wires 4) placed in the aluminum member and a gap within the groove can be reduced. A laser beam welding may be applied to the above-described welding. In this case, when the nearest portion to the welding portion is pressed by a pressing roll, the same effect as FSW can be obtained. Incidentally, the above-described groove of two stage portions, i.e., the narrow width groove portion 5 and the wide width groove portion 6 may be the groove of one stage, i.e., one groove portion. Furthermore, the metal fitting member (the second member) 2 may be the same material of the groove-type aluminum member (the first member) 1 with the rectangular cross section, or other metal member of a different material.

Figure 1B:
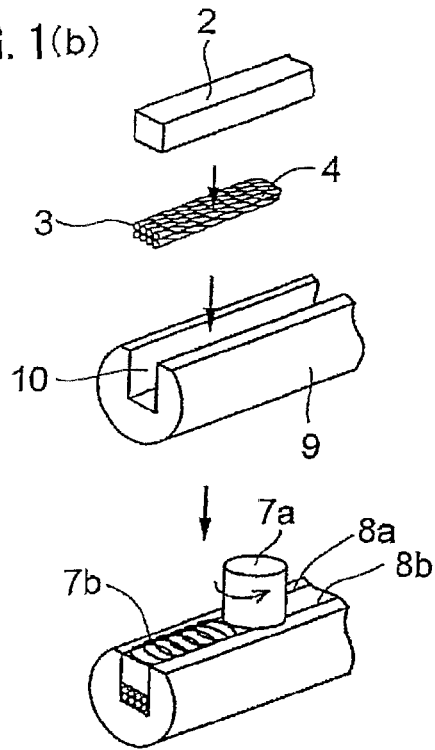
FIG. 1(b) illustrates a composite superconductor having a circular cross section with a flat portion and two welded portions in which two joint portions are concurrently welded by FSW.

FIG. 1(b) is a view illustrating a composite superconductor having a circular cross section with a flat portion. The formed superconductor twisted wires 4 is placed on the flat portion in the groove portion 10 of the groove-type aluminum member (a first member) 9 with a circular cross section, a metal fitting member (a second member) 2 is fitted into the groove portion 10, and then, the portion between two joint portions 8a, 8b is pressed by a rotating tool 7a of FSW so that the two joint portions 8a, 8b are welded at once. Incidentally, the above-described groove of one stage portion may be the groove of two stages, i.e., the narrow groove portion 5 and the wide groove portion 6, as illustrated in FIG. 1(a). Furthermore, the metal fitting member (the second member) 2 may be the same material of the groove-type aluminum member (the first member) 9 with the circular cross section, or other metal member of a different material.

Figure 1C:
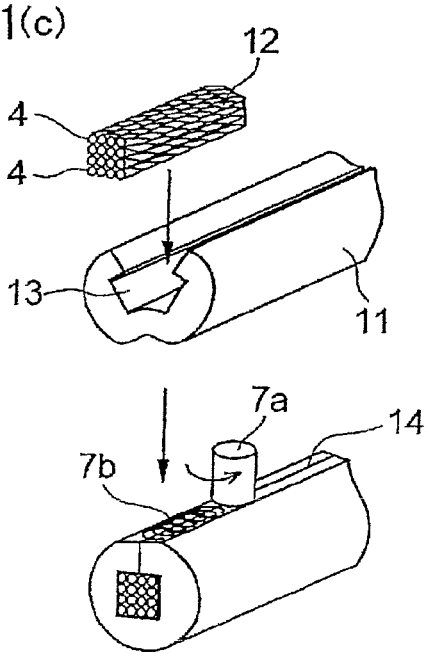
FIG. 1 is a view illustrating embodiments of the composite superconductor of the invention.
FIG. 1(d) illustrates a composite superconductor having a circular cross section with a flat portion and two welded portions in which two joint portions are respectively welded by FSW.

FIG. 1(c) is a view illustrating a composite superconductor having a circular cross section with a flat portion and an opening portion. A groove-type aluminum member 11 having a circular cross section with the flat portion and the opening portion has a groove portion 13 beneath the opening portion, in which the layered superconductors 12 are placed. One portion of the aluminum member is cut opened as the opening portion. The layered superconductors 12 comprising a plurality of formed superconductor twisted wires 4 (i.e., two formed superconductor twisted wires 4 are layered in the drawing) are placed within the aluminum member through the portion cut opened, the portion cut opened is closed, and then, a joint portion 14 is welded by FSW, thus the layered superconductors 12 are placed within the groove-type aluminum member 11 having the circular cross section. There is a method of closing the opening portion in which a bottom portion of the groove-type aluminum member 11 having the circular cross section is deformed within the elastic deformation thereof, the layered superconductors 12 are placed in the groove portion 13 thus opened, and then the aluminum member is closed using elasticity. There is another method of closing the opening portion in which the groove-type aluminum member originally having the opening portion large enough to receive the layered superconductors 12 within the groove portion, the layered superconductors 12 are placed in the groove portion 13 thus opened, and then the aluminum member is mechanically closed by the use of a side roll or a fastening dice.

Figure 1D:
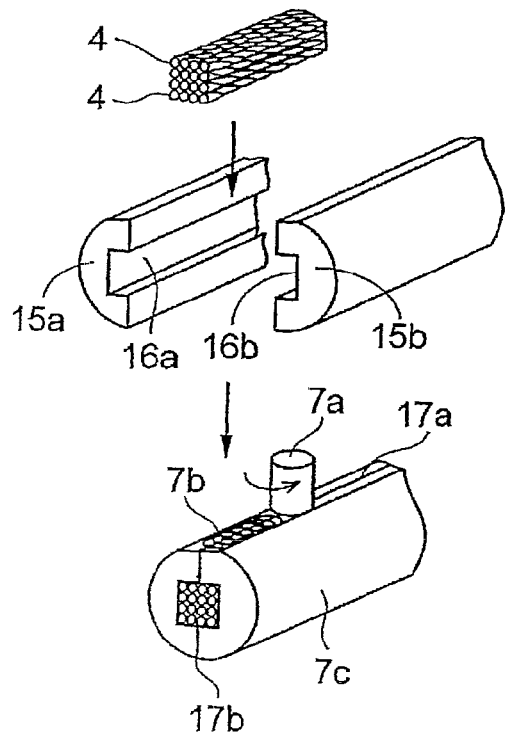

FIG. 1(d) is a view illustrating a composite superconductor having a circular cross section divided into two parts with respective flat portions on which the superconductor is placed within the divided groove-type aluminum members. The layered superconductors 12 is placed in a sandwich manner between the divided groove portions 16a, 16b of the divided groove-type aluminum members 15a, 15b having the circular cross section divided into two parts with respective flat portions, and then the divided aluminum members 15a, 15b are closed. Then, the joint portions 17a, 17b of thus closed divided aluminum members are welded by FSW while a pressure is applied to the layered superconductors 12.

The aluminum member(s) to be combined with the superconductor like the layered superconductors may have the shape in which the superconductor is placed. It is preferable that the aluminum member has the structure in which the superconductor placed within the aluminum member is pressed from outside to the bottom face of the groove portion upon welding.

Figure 2A:
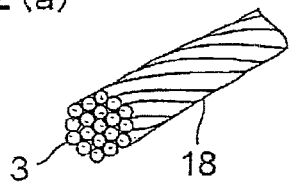
FIG. 2(a) illustrates round twisted wires comprising 19 pieces of round cross-sectional superconductor wires.
Figure 2B:
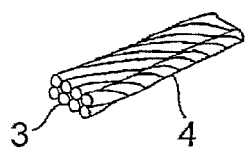
FIG. 2(b) illustrates a formed superconductor twisted wires in which 8 pieces of round cross-sectional superconductor wires are formed by being twisted and compressed.
Figure 2C:
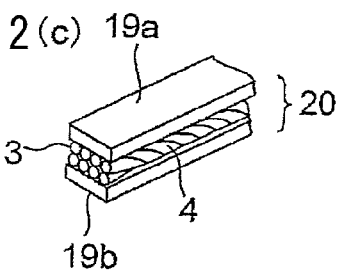
FIG. 2(c) illustrates a formed composite superconductor twisted wires in which the formed superconductor twisted wires are placed between two metal members in sandwiched manner.

Examples of the superconductors to be used for the composite superconductor are shown in FIGS. 2(a) to 2(g). FIG. 2(a) illustrates superconductor twisted round wires in which a plurality of superconductor round-shaped wires are twisted into a round shape. Here, 19 pieces of the superconductor round-shaped wires are twisted into the superconductor twisted round wires 18, however, the number of the superconductor round-shaped wire is not limited to the above. FIG. 2(b) illustrates a formed superconductor twisted wires 4 (i.e., formed rectangular twisted wire) in which a plurality of superconductor round-shaped wires 3 are twisted into a rectangular shape. Here, 8 pieces of the superconductor round-shaped wires are twisted into the formed superconductor twisted wires 4, however, the number of the superconductor round-shaped wire is not limited to the above. FIG. 2(c) illustrates a composite superconductor comprising formed superconductor twisted wires 4 and aluminum plates 19a, 19b as heat transfer member placed on the respective upper and lower faces of the formed superconductor twisted wires 4. Here, 8 pieces of superconductor wires are formed into the rectangular-shaped superconductor twisted wires 4, however, the number of the superconductor wire is not limited to the above.

Figure 2D:
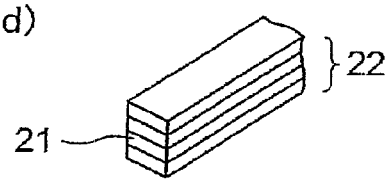
FIG. 2(d) illustrates a layered superconductor in which 4 pieces of tape-shaped superconductor wires are layered in vertical direction.
Figure 2E:
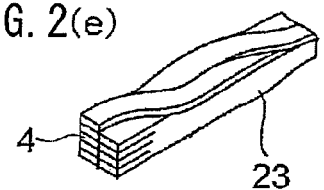
FIG. 2(e) illustrates a transposed superconductor in which 9 pieces of the formed superconductor twisted wires are transposed.
Figure 2F:
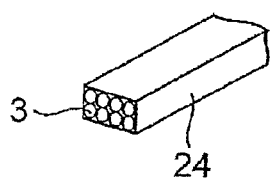
FIG. 2(f) illustrates an impregnated superconductor in which the formed superconductor twisted wires are impregnated in the solder.
Figure 2G:
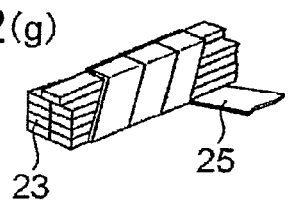
FIG. 2(g) illustrates another embodiment of the superconductor in which the transposed superconductor with 9 pieces of the formed superconductor twisted wires transposed is wound around by a tape-shaped metal member.

In addition, the aluminum plates 19a, 19b are used as the heat transfer member, however, the material is not limited to aluminum. FIG. 2(d) illustrates layered super conductors comprising a plurality of tape-shaped superconductors. Here, 4 pieces of tape-shaped superconductors are layered, however, the number of the tape-shaped superconductor is not limited to the above. FIG. 2(e) illustrates a transposed superconductor 23 comprising odd-numbered rectangular-shaped twisted formed superconductors which are assembled while being transposed. Here, 9 pieces of rectangular-shaped twisted superconductor are transposed, however, odd number of the rectangular-shaped twisted superconductor is not limited to the above. FIG. 2(f) illustrates an embodiment in which superconductor twisted wires 4 are formed into a rectangular shape and impregnated into solder 24 as medium of the heat transfer member. Here, 8 pieces of the superconductor wires 3 are formed into rectangularly formed superconductor twisted wires 4, however, number of the superconductor wires is not limited to the above. In addition, the solder 24 is used for the medium of the transfer member, however, the material of the medium is not limited to the solder. FIG. 2 (g) illustrates another embodiment in which aluminum tape is wound around the transposed superconductor 23. Here, 9 pieces of rectangular-shaped twisted superconductor 4 are transposed, however, odd number of the rectangular-shaped twisted superconductor is not limited to the above. In addition, aluminum is used for the tape, however, the material of the tape is not limited to aluminum.

The superconductor used for the composite superconductor may be selected from the above-described various embodiments. A monolithic superconductor wire may also be used for the composite superconductor. In particular, as an indirectly cooled composite superconductor, it is preferable that the superconductor is densely placed within the groove-type aluminum member, and the superconductor is closely contacted with the surrounding aluminum member. Thus, the superconductor is fully cooled by the enclosing aluminum member. In this regard, the depth d of the groove portion (i.e., in FIG. 1(a), narrow width groove portion 5) is set to be smaller than the thickness t of the superconductor (i.e., in FIG. 1(a), the formed superconductor twisted wires 4), thus the superconductor is pressed to the inner bottom face of the groove-type aluminum member when compressed from the upper side thereof so that electrical contact condition, mechanical stability, heat transferability or the like can be excellently maintained.

It is necessary that the superconductor and the metal member are sufficiently contacted in order to cool the superconductor used for the composite superconductor below the critical temperature by the metal member enclosing the superconductor. For this purpose, the superconductor is impregnated into the soldering metal, or the tape such as aluminum tape is wound around the superconductor as the heat transfer member so that the heat transfer from the superconductor to the heat transfer member is enhanced. Here, a ratio of the total cross sectional area of the superconductor and the heat transfer member to the hollow portion (hereinafter referred to as a "filling rate") in the vertical cross section of the composite superconductor is limited to at least 70%. With the filling rate being below 70%, it becomes remarkably difficult to control the respective heat, mechanical, and electrical contact conditions between the superconductor and the metal member, thus not preferable. Incidentally, the filling rate can be appropriately selected according to the cross sectional design of the members of the composite superconductor as well as a pressure applied to the superconductor.

Figure 3A:
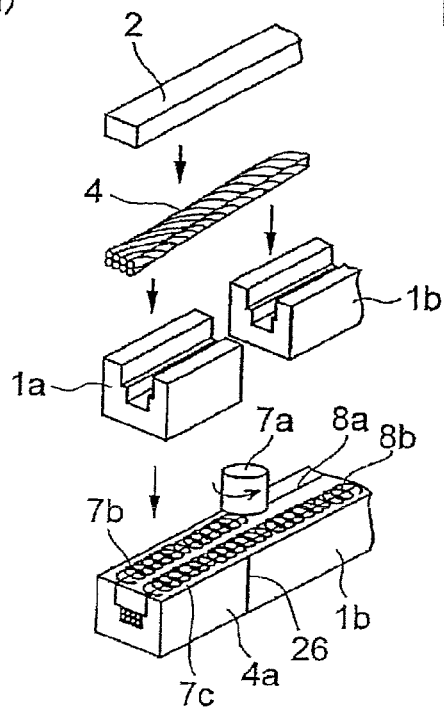
FIG. 3(a) illustrates a fabricating process of the composite superconductor in which the groove-type metal members are welded in a longitudinal direction by FSW, when the groove-type metal member is shorter than the fitting member and the superconductor in a longitudinal direction.
Figure 3B:
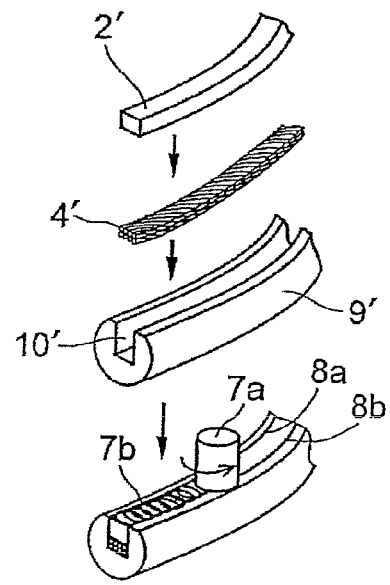
FIG. 3(b) illustrates another fabricating process of the composite superconductor in which the groove-type metal member is formed in a prescribed coil shape in advance, then a distortion within a range not to affect superconductivity to the superconductor, then the superconductor is placed in the groove, then the fitting member is fitted to the groove, and then the joint portions are welded by FSW.

FIG. 3 illustrates embodiments of a long composite superconductor. FIG. 3(a) illustrates an embodiment of the long composite superconductor in which the length of the groove-type aluminum member 1 having a rectangular cross section is shorter than the formed superconductor twisted wires 4, and two groove-type aluminum members 1 having a rectangular cross section are connected. A plurality of groove-type aluminum members 1 each having the corresponding rectangular cross section are connected without gap. The formed superconductor twisted wires 4 is placed in the narrow width groove portion 5 formed in the connected groove-type aluminum members in the same manner as described with reference to FIG. 1(a). The fitting member 2 is fitted into the wide width groove portion 6, and then the joint portions 7a, 7b are respectively welded by FSW. When a plurality of the groove-type aluminum members 1 each having the corresponding rectangular cross section may be welded, the joint portion in the peripheral direction 26 may be welded by FSW, or the laser beam welding. Other welding methods can be applied thereto. The embodiments described with reference to FIGS. 1(b) to 1(d) can be connected in the similar manner as the embodiment described with reference to FIG. 1(a). FIG. 3(b) illustrates an embodiment in which the aluminum member is formed to a prescribed coil-shape aluminum member in advance, then, such distortion as those within a range not to affect the properties of the superconductor is applied to the superconductor, then, the superconductor is placed within the groove portion, and then the joint portions are welded. More specifically, the formed superconductor twisted wires with such the distortion as those within a range not to affect the properties of the superconductor applied, are placed in the bent groove portion 10' of the formed aluminum member having, a circular cross section with flat portion also bent into the prescribed coil shape. Then, the correspondingly bent fitting member 2' to the bent groove portion 10' is fitted therein, and then, the rotating tool is contacted with the portion between two joint portions on the upper surface of the aluminum member, and the joint portions are welded by FSW. In addition to the embodiment described with reference to FIG. 1(b), other embodiments shown in FIGS. 1(a), 1(c), and 1(d) can be formed into the respective long composite superconductors in the similar manner.

EXAMPLE 1

$Nb_3Sn$ superconductor wire 3 not reaction heat treated is manufactured by bronze method, which has a diameter of 0.82 mm, a copper ratio of 1, a bronze ratio of 2.3, a diameter of the filament of 3.5 mm, and a twist pitch of 25 mm, and thus manufactured $Nb_3Sn$ superconductor wire 3 is plated on the surface thereof by chromium (Cr). 8 pieces of the Cr plated Nb3Sn superconductor wire 3 are twisted and formed to be rectangular twisted wires, and then, subjected to the reaction heat treatment at the temperature of 650 degree centigrade for 96 hours in an argon atmosphere, thus the reaction heat treated $Nb_3Sn$ superconductor rectangular twisted wires 4 having the width of 3.4 mm, the thickness of 1.57 mm, and twist pitch of 35 mm is prepared.

Two stage groove comprising a wide width groove portion having a width of 7 mm and a depth of 5 mm and a narrow width groove portion having a width of 3.5 mm and a depth of 1.55 mm is formed in the middle of an aluminum alloy (3004) (tempering H112) having a width of 17 mm and a thickness of 11 mm to prepare the groove-type aluminum member 11 having a rectangular cross section. In addition, a fitting member to be fitted to the wide width groove portion of the width of 7 mm and a depth of 5 mm is prepared by an aluminum alloy (3004) (tempering H112). The reaction heat treated $Nb_3Sn$ superconductor rectangular twisted wires 4 is inserted into the narrow width groove portion 5 having a width of 3.5 mm and a depth of 1.55 mm. The fitting member 2 is fitted to the wide width groove portion 6 having a width of 7 mm and a depth of 5 mm. Then, two joint portions 8b, 8c between the groove-type aluminum member 1 with the rectangular cross section and the fitting member are respectively welded by FSW. Upon welding, when the rotating tool 7a of FSW is pressed to the fitting member 2, the pressure is indirectly applied to the wide width surface of the reaction heat-treated $Nb_3Sn$ superconductor rectangular twisted wires 4 in the vertical direction thereof, thus the composite superconductor 5 having the width of 17 mm and the thickness of 11 mm. Incidentally, upon welding, a steel-made rotating tool is used with the number of rotations of 2500 rpm, welding speed of 200 mm/min, and under the condition that the tool is moved horizontally.

EXAMPLE 2

$Nb_3Sn$ superconductor wire 3 not reaction heat treated is manufactured by bronze method, which has a diameter of 0.82 mm, a copper ratio of 1, a bronze ratio of 2.3, a diameter of the filament of 3.5 mm, and a twist pitch of 25 mm, and thus manufactured $Nb_3Sn$ superconductor wire 3 is plated on the surface thereof by chromium (Cr). 8 pieces of the Cr plated $Nb_3Sn$ superconductor wire 3 are twisted and formed to be rectangular twisted wires 4 having the width of 3.4 mm, the thickness of 1.57 mm, and the twist pitch of 35 mm. 9 pieces of thus formed superconductor rectangular twisted wires 4 are transposed with the pitch of 55 mm to form the transposed superconductor having the width of 7.0 mm and the thickness of 8.0 mm, and then, the transposed superconductor is subjected to the reaction heat treatment at the temperature of 650 degree centigrade for 96 hours in an argon atmosphere, thus the reaction heat treated Nb3Sn transposed superconductor is prepared.

The groove having a width of 7.2 mm and a depth of 12.5 mm is formed in the middle of an aluminum alloy (3004) (tempering H112) having a width of 17 mm and a thickness of 17 mm to prepare the groove-type aluminum member 11 having a rectangular cross section. In addition, a fitting member 2 having the width of 7.1 mm and the thickness of 4.5 mm to be fitted to the groove, in which the reaction heat treated $Nb_3Sn$ transposed superconductor 23 is inserted, is prepared by an aluminum alloy (3004) (tempering H112). The reaction heat treated Nb3Sn transposed superconductor 23 is inserted into the groove 10 of the groove type aluminum member 1. The fitting member 2 is fitted to the groove 10. Then, two joint portions 8a, 8b between the groove-type aluminum member 1 with the rectangular cross section and the fitting member 2 are respectively welded by FSW. Upon welding, when the rotating tool 7a of FSW is pressed to the fitting member 2, the pressure is indirectly applied to the wide width surface of the Nb3Sn superconductor rectangular twisted wires 4 in the reaction heat-treated Nb3Sn transposed superconductor 23 in the vertical direction thereof, thus the composite superconductor having the width of 17 mm and the thickness of 17 mm. Incidentally, upon welding, a steel-made rotating tool in the same manner as described in Example 1 is used with the number of rotations of 2500 rpm, welding speed of 200 mm/min, and under the condition that the tool is moved horizontally.

COMPARATIVE EXAMPLE

The same reaction heat treated $Nb_3Sn$ superconductor rectangular twisted wires 4 as described in Example 1 is prepared. Then a composite superconductor having the same outside dimension as that of Example 1 is prepared, using the aluminum member and the above described reaction heat treated $Nb_3Sn$ superconductor rectangular twisted wires 4 by means of an extrusion coating method (i.e., conform method), thus preparing the comparative example.

The composite superconductors of the examples 1 and 2 of the present invention and the composite superconductor of the comparative example are compared in performance. The result thereof is shown in Table 1. As is shown in Table 1, the critical current is not deteriorated in the composite superconductor of the example 1, while the critical current is deteriorated down to less than half in the composite superconductor of the comparative example. In the composite superconductor of the example 2, the critical current is not deteriorated in almost same manner as that of the example 1, and at least 10 kA of current carrying is possible under the condition of 10 T external magnetic field. In addition, the composite superconductor of the example 2 shows the critical current density of the conductor current per total cross sectional area, which is at least 5 times of that of the composite superconductor of the example 1.

This means that even if the size of the superconductor becomes large, the outside dimension of the aluminum member remains the same, thus the ratio of the metal member to the overall size of the composite superconductor can be relatively small. Furthermore, the strength of the aluminum members in the composite superconductor of the examples 1 and 2 remains unchanged, while the strength of the aluminum member in the composite superconductor of the comparative example is deteriorated due to the heat generated during the extrusion. The heat transfer property in the composite superconductors of the examples 1 and 2 fully satisfy the practical level, even though the composite superconductor of the comparative example is high due to the metallic binding of the superconductor and the aluminum member.

As is clear from the foregoing, the effect of suppressing deterioration of the critical current properties in the composite superconductor of the present invention can be confirmed. In addition, it is clear that the composite superconductor of the invention is effective when it is applied as the large capacity conductor. Thus, the composite superconductor of the invention is comprehensively excellent than the conventional composite superconductor.

TABLE 1

Comparison of the present invention with the conventional art

| | Structure of Nb3Sn superconductor | Metal member | Critical current density per total cross sectional area of the conductor | Strength of aluminum | Heat transfer property | Comprehensive evaluation |
|---|---|---|---|---|---|---|
| Example 1 | 8 pieces of formed | A3004 | ○ | ○ | ○ | ○ |

TABLE 1-continued

Comparison of the present invention with the conventional art

| | Structure of Nb3Sn superconductor | Metal member | Critical current density per total cross sectional area of the conductor | Strength of aluminum | Heat transfer property | Comprehensive evaluation |
|---|---|---|---|---|---|---|
| Example 2 | twisted wires 8 pieces of formed twisted wires, 9 pieces of transposed conductors | A3004 | ◉ | ○ | ○ | ◉ |
| Comparative example | 8 pieces of formed twisted wires | A3004 | X | Δ | ◉ | X |

○: good
◉: very good
X: deteriorate
Δ: less deteriorate

INDUSTRIAL AVAILABILITY

The composite superconductor of the invention can be applied widely to a large scale indirect-cooling superconductor such as thermonuclear generator, large scale SMES or the like, heat transfer-type small and medium scale superconductor such as pulse-type SMES or the like, and the superconductor used for superconductor applied equipment such as a linear motor car, electric transformer, electric generator or the like.

The invention claimed is:

1. A composite superconductor comprising:
Superconductor;
a friction stir welding (FSW) layer: and
a metal body which comprises two or more metal members joined to each other in such a manner that each of the metal members directly covers the superconductor, at least one of the metal members being aluminum or aluminum alloy wherein
each of the metal members joined to each other has a groove formed on a joint surface of the metal member, the joint surface being uniform in a longitudinal direction, and
the superconductor is placed in the groove so as to contact the respective metal members via at least one of a gap and a heat transfer member which enable to control heat, mechanical or electrical contact conditions between the superconductor and the metal members, said friction stir welding (FSW) layer joining the gap and the heat transfer member and the metal members.

2. The composite superconductor according to claim 1, wherein the superconductor is sandwiched between the metal members.

3. The composite superconductor according to claim 1, wherein the metal members are joined to each other in such a manner that a pressure is applied to the superconductor to reduce the gap within the groove.

4. The composite superconductor according to claim 1, wherein the superconductor has a wide width surface facing the joint surface of the metal member, and the metal members are joined to each other in such a manner that a pressure is applied to the wide width surface of the superconductor.

5. The composite superconductor according to claim 1, wherein the metal body comprises a first metal member having a groove and a second metal member fitted to an upper portion of the groove, and the superconductor is placed in a hollow portion formed by combining the first metal member and the second metal member.

6. The composite superconductor according to claim 5, wherein the superconductor is placed itself or together with the heat transfer member in the hollow portion, and a ratio of a total cross sectional area of the superconductor and the heat transfer member to the cross sectional area of said hollow portion is at least 70%.

7. The composite superconductor according claim 1, wherein the cross section of the metal body is substantially circular.

8. The composite superconductor according to claim 6, wherein the superconductor comprises a compound superconductor material.

9. A composite superconductor made by the steps comprising:
providing a superconductor, a metal body which comprises two or more metal members and a heat transfer member, at least one of the metal members being aluminum or aluminum alloy;
placing the superconductor in a groove formed by the metal members as they are joined to each other in such a manner that each of the metal members directly covers the superconductor; and
forming a friction stir welding (FSW) layer joining a gap between at least two of the metal members, the two of the joined metal members being uniform in a longitudinal direction.

10. The composite superconductor according to claim 9 further comprising a step of providing a heat transfer member on the superconductor.

11. A method of manufacturing composite superconductor, comprising the steps of:
   placing a superconductor in a groove formed by metal members as they are joined to each other in such a manner that each of the metal members directly covers the superconductor; and
   forming a friction stir welding (FSW) layer by joining a gap between at least two of the metal members resulting in a joint portion and having an external surface of the joint portion of the metal members, wherein a friction stir surface is successively formed in a longitudinal direction by said friction stir welding (FSW) layer.

12. The method of manufacturing composite superconductor according to claim 11 further comprising a step of providing a heat transfer member on the superconductor.

\* \* \* \* \*